(12) United States Patent
Ukigaya et al.

(10) Patent No.: US 11,139,330 B2
(45) Date of Patent: Oct. 5, 2021

(54) PHOTOELECTRIC CONVERSION APPARATUS, CAMERA, AND MOVING BODY

(71) Applicant: CANON KABUSHIKI KAISHA, Tokyo (JP)

(72) Inventors: Nobutaka Ukigaya, Yokohama (JP); Hideshi Kuwabara, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/831,443

(22) Filed: Mar. 26, 2020

(65) Prior Publication Data

US 2020/0227450 A1 Jul. 16, 2020

Related U.S. Application Data

(63) Continuation of application No. 15/495,790, filed on Apr. 24, 2017, now Pat. No. 10,665,328.

(30) Foreign Application Priority Data

Apr. 28, 2016 (JP) .................. 2016-091579

(51) Int. Cl.
*H01L 27/146* (2006.01)
*H04N 5/374* (2011.01)

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14645* (2013.01); *H04N 5/374* (2013.01)

(58) Field of Classification Search
CPC ............ H01L 27/1463; H01L 27/146; H01L 27/14621; H01L 27/14627; H01L 27/14645; H04N 5/374

See application file for complete search history.

(56) References Cited

U.S. PATENT DOCUMENTS

2007/0194397 A1 8/2007 Adkisson et al.
2016/0204144 A1* 7/2016 Lee .................. H01L 27/14643
257/229

FOREIGN PATENT DOCUMENTS

JP    2013-175494 A    9/2013
JP    2014-204047 A    10/2014
WO    2011/077580 A1   6/2011

* cited by examiner

*Primary Examiner* — Ahmed A Berhan
(74) *Attorney, Agent, or Firm* — Canon U.S.A., Inc. IP Division

(57) ABSTRACT

A photoelectric conversion apparatus that includes a pixel region having photoelectric conversion elements includes a semiconductor layer having first and second surfaces, and the photoelectric conversion elements are disposed between the first and second surfaces. With a virtual plane extending along the second surface between the first and second surfaces being a third plane, the pixel region includes an element isolating portion constituted by an insulator disposed closer to the first surface than the third plane, and first and second isolating portions constituted by grooves provided in the semiconductor layer to pass through the third plane. The first isolating portion overlaps the element isolating portion in a normal direction to the third plane. An end of the second isolating portion on a side on the first surface is closer to the second surface than an end of the first isolating portion on a side on the first surface is.

22 Claims, 5 Drawing Sheets

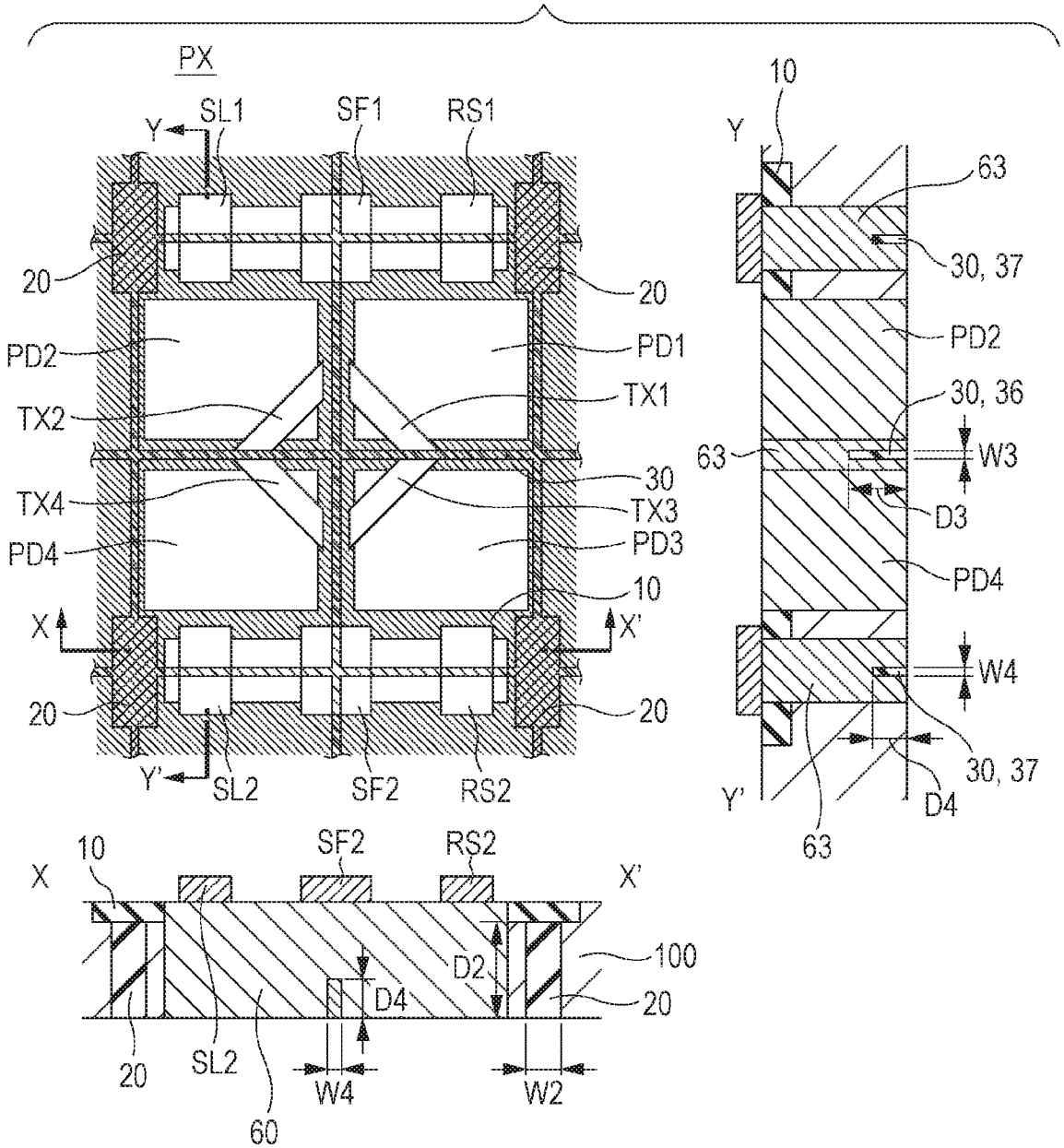

PHOTOELECTRIC CONVERSION APPARATUS, CAMERA, AND MOVING BODY

CROSS-REFERENCE TO RELATED APPLICATIONS

The present application is a continuation of U.S. patent application Ser. No. 15/495,790, filed on Apr. 24, 2017, which claims priority from Japanese Patent Application No. 2016-091579 filed Apr. 28, 2016, which are all hereby incorporated by reference herein in their entireties.

BACKGROUND OF THE INVENTION

Field of the Invention

The present disclosure relates to a photoelectric conversion apparatus.

Description of the Related Art

There has been a study on providing a groove in a semiconductor layer in a photoelectric conversion apparatus, such as a complementary metal-oxide semiconductor (CMOS) image sensor, for use in a camera. As an isolating portion constituted by the groove acts as a barrier for light, an electric charge, and so on, the sensitivity improves, and color mixing is suppressed. Thus, the performance of the photoelectric conversion apparatus can be improved.

U.S. Patent Application Publication No. 2013/0069190 indicates that trenches (105) that extend to a shallow trench isolator (STI) (111) on a side of a front-side surface (101a) of a substrate (101) are provided from a side of a back-side surface (101b) of the substrate (101) on which a photoelectric transducer device (102) is provided.

Although U.S. Patent Application Publication No. 2013/0069190 is silent as to the two-dimensional layout of the trenches, depending on the layout of the trenches, the improvement in the performance of the photoelectric conversion apparatus may not be sufficient, or the performance of the photoelectric conversion apparatus may decrease on the contrary. One of the reasons for this is that the improvement in the sensitivity may be limited or noise may increase depending on the positions at which the trenches are disposed, for example.

Accordingly, the present technique is directed to improving the performance of a photoelectric conversion apparatus.

SUMMARY OF THE INVENTION

An aspect of the present disclosure provides a photoelectric conversion apparatus that includes a pixel region having a plurality of photoelectric conversion elements. The photoelectric conversion element includes a semiconductor layer having a first surface and a second surface, the second surface being opposite to the first surface, the plurality of photoelectric conversion elements being disposed between the first surface and the second surface. With a virtual plane that extends along the second surface between the first surface and the second surface being a third plane, the pixel region includes an element isolating portion, a first isolating portion, and a second isolating portion, the element isolating portion being constituted by an insulator disposed closer to the first surface than the third plane, the first isolating portion and the second isolating portion each being constituted by a groove provided in the semiconductor layer so as to pass through the third plane. The first isolating portion overlaps the element isolating portion in a normal direction with respect to the third plane. An end of the second isolating portion on a side on the first surface is located closer to the second surface than an end of the first isolating portion on a side on the first surface is.

Further features of the present disclosure will become apparent from the following description of exemplary embodiments with reference to the attached drawings.

BRIEF DESCRIPTION OF THE DRAWINGS

FIG. 4 is a schematic diagram for describing a photoelectric conversion apparatus.

DESCRIPTION OF THE EMBODIMENTS

Figure 1A:
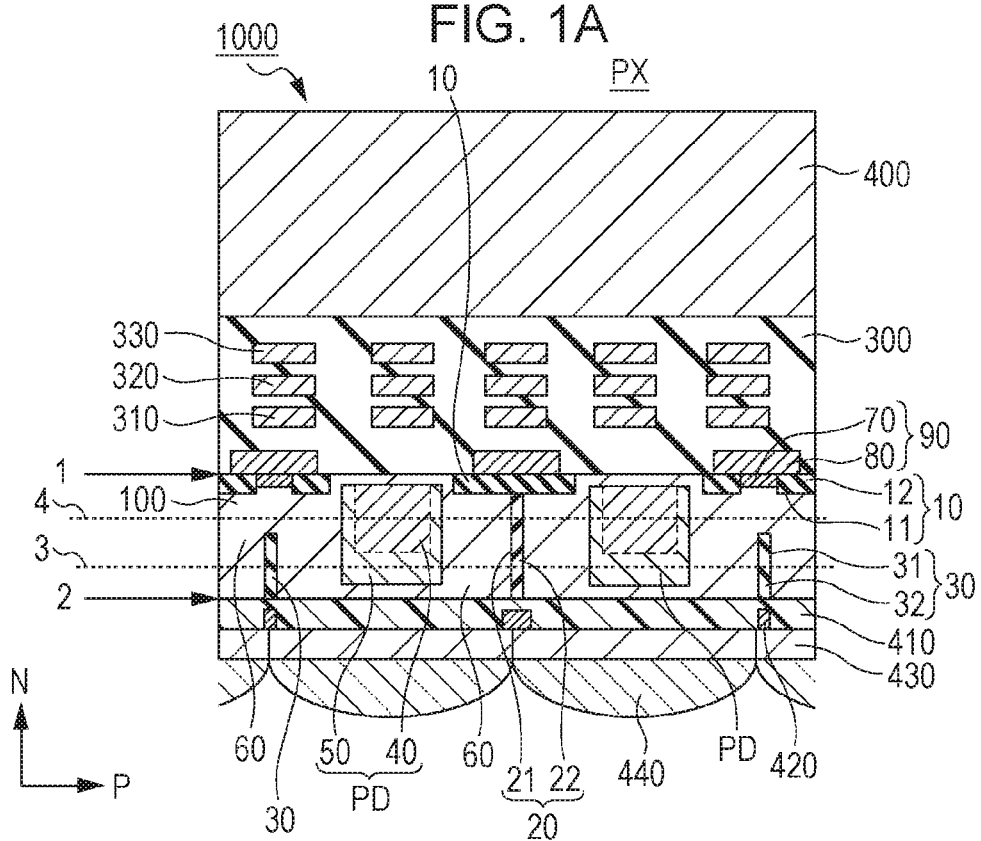
FIGS. 1A and 1B are schematic diagrams for describing a photoelectric conversion apparatus.

Hereinafter, exemplary embodiments for implementing the present disclosure will be described with reference to the drawings. In the following description and in the drawings, components that are common across a plurality of drawings are given common reference characters. Thus, such common components are described by cross-referencing a plurality of drawings, and descriptions of components given common reference characters will be omitted as appropriate.

Figure 1B:
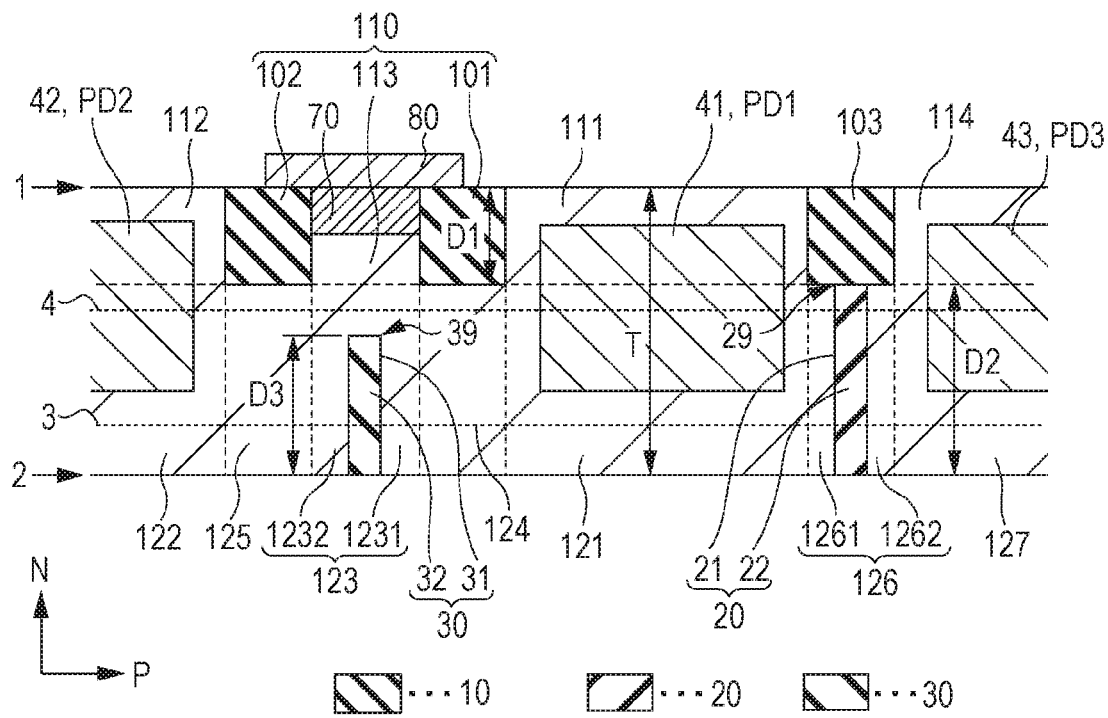

FIG. 1A is a sectional view illustrating an exemplary embodiment of a back-side illuminated imaging apparatus, which serves as an example of a photoelectric conversion apparatus. FIG. 1B is an enlarged view of the structure of a semiconductor layer of the photoelectric conversion apparatus and of the vicinity thereof.

A photoelectric conversion apparatus 1000 includes a pixel region PX that includes a plurality of photoelectric conversion elements PD. As will be described later, the pixel region PX further includes isolating portions that electrically or optically isolate various elements. The pixel region PX may further include a color filter array and a microlens array. The photoelectric conversion apparatus 1000 includes a peripheral region (not illustrated) aside from the pixel region PX. In the peripheral region, a driving circuit for driving a circuit (pixel circuit) in the pixel region PX, a signal processing circuit for processing a signal from the pixel circuit, and so on are provided. Hereinafter, the configuration of the pixel region PX of the photoelectric conversion apparatus 1000 will be described in detail.

The photoelectric conversion apparatus 1000 includes a semiconductor layer 100 having a front surface 1 and a back surface 2, which is opposite to the front surface 1. The photoelectric conversion elements PD of the pixel region PX are disposed in the semiconductor layer 100. The photoelectric conversion elements PD are disposed between the front surface 1 and the back surface 2. The semiconductor layer 100 is, for example, a single crystal silicon layer, but the semiconductor layer 100 is not limited to a single crystal silicon layer and can be any semiconductor layer capable of photoelectric conversion. The semiconductor layer 100 has a thickness T of approximately 1 μm to 10 μm (see FIG. 1B).

The thickness T of the semiconductor layer 100 matches the distance between the front surface 1 and the back surface 2.

The photoelectric conversion apparatus 1000 further includes an element isolating portion 10 provided on a side of the front surface 1, and the element isolating portion 10 is constituted by a groove 11 in the semiconductor layer 100 and an insulator 12 in the groove 11. The element isolating portion 10 may have a shallow trench isolation (STI) structure or a local oxidation of silicon (LOCOS) structure. The groove 11 of the element isolating portion 10 has a depth D1 of approximately 100 nm to 1000 nm relative to the front surface 1 (see FIG. 1B). The insulator 12 that partially constitutes the element isolating portion 10 is made, for example, of silicon oxide.

The photoelectric conversion apparatus 1000 further includes a pixel isolating portion 20, which is constituted by a groove 21 provided in the semiconductor layer 100. The pixel isolating portion 20 is disposed so as to pass through a plane 3. The plane 3 is a virtual plane that lies between the front surface 1 and the back surface 2. The plane 3 is closer to the back surface 2 than to the element isolating portion 10 and extends along the front surface 1 and/or the back surface 2. The plane 3 can be set to a position between an intermediate plane, which is a virtual plane located at an equidistance from the front surface 1 and the back surface 2, and the back surface 2 or, for example, to a position of T/4 from the back surface 2. The plane 3 may be parallel to the back surface 2. The direction perpendicular to the plane 3 is referred to as a normal direction N, and the direction parallel to the plane 3 is referred to as an in-plane direction P. In the normal direction N, the pixel isolating portion 20 extends toward both the front surface 1 and the back surface 2 from the plane 3. In the present example, the groove 21 is provided in the semiconductor layer 100 from the back surface 2 toward the front surface 1. Therefore, the groove 21 has a side surface that is continuous with the back surface 2. Here, the groove 21 may instead be provided in the semiconductor layer 100 from the front surface 1 toward the back surface 2, and the groove 21 does not have to reach the back surface 2. The groove 21 of the pixel isolating portion 20 has a depth D2 of approximately 1 µm to 10 µm relative to the back surface 2 (see FIG. 1B). The semiconductor layer 100 is discontinuous within the plane 3 with the pixel isolating portion 20 interposed therein. A solid 22 may be present in the groove 21 of the pixel isolating portion 20, the space within the groove 21 may be in vacuum, a gas may be present in the groove 21, or a gas and the solid 22 may both be present in the groove 21. The solid 22 that can be present in the groove 21 may be an insulator, a conductor, or a semiconductor. A typical insulator that can serve as the solid 22 present in the groove 21 is silicon oxide, but silicon nitride, silicon oxynitride, tantalum oxide, hafnium oxide, titanium oxide, or the like can also be used. A typical conductor that can serve as the solid 22 present in the groove 21 is metal or polysilicon, but aluminum, copper, tungsten, titanium, titanium nitride, tantalum, tantalum nitride, metal silicide, or the like can also be used. A typical semiconductor that can serve as the solid 22 present in the groove 21 is single crystal silicon, but amorphous silicon may also be used. The conductivity type of a semiconductor that serves as the solid 22 present in the groove 21 may be a conductivity type that is opposite to a signal charge accumulated in a photoelectric conversion element, which will be described later.

The photoelectric conversion apparatus 1000 further includes a pixel isolating portion 30, which is constituted by a groove 31 provided in the semiconductor layer 100. The pixel isolating portion 30 is also disposed so as to pass through the plane 3. The groove 31 is provided in the semiconductor layer 100 from the back surface 2 toward the front surface 1. Therefore, the groove 31 has a side surface that is continuous with the back surface 2. The groove 31 of the pixel isolating portion 30 has a depth D3 of approximately 1 µm to 10 µm relative to the back surface 2 (see FIG. 1B). The semiconductor layer 100 is discontinuous within the plane 3 with the pixel isolating portion 30 interposed therein. A solid 32 may be present in the groove 31 of the pixel isolating portion 30, the space within the groove 31 may be in vacuum, a gas may be present in the groove 31, or a gas and the solid 32 may both be present in the groove 31. The solid 32 that can be present in the groove 31 is the same as the solid 22 that can be present in the groove 21 of the pixel isolating portion 20, and thus descriptions thereof will be omitted.

The position of the pixel isolating portion 20 differs from the position of the pixel isolating portion 30 in the in-plane direction P. The pixel isolating portion 20 overlaps the element isolating portion 10 in the normal direction N. In other words, as illustrated in FIG. 1A, the pixel isolating portion 20 is disposed underneath the element isolating portion 10. The pixel isolating portion 30 is disposed at a position different from the position of the pixel isolating portion 20 within the plane 3. The positions of the pixel isolating portion 20 and of the pixel isolating portion 30 within the in-plane direction P will be described later in detail.

The depth of the pixel isolating portion 20 differs from the depth of the pixel isolating portion 30 in the normal direction N. The pixel isolating portion 30 is shallower than the pixel isolating portion 20 relative to the back surface 2. With reference to FIG. 1B, the pixel isolating portion 20 and the pixel isolating portion 30 will be described. The depth D2 of the pixel isolating portion 20 from the back surface 2 is greater than the depth D3 of the pixel isolating portion 30 from the back surface 2 (D2>D3). In other words, an end 39 of the pixel isolating portion 30 on a side on the front surface 1 is located closer to the back surface 2 than an end 29 of the pixel isolating portion 20 on a side on the front surface 1 is. FIG. 1A illustrates a plane 4. The plane 4 is a virtual plane located between the front surface 1 and the back surface 2. The plane 4 is closer to the back surface 2 than the element isolating portion 10 is and closer to the front surface 1 than the plane 3 is and extends along the front surface 1 and/or the back surface 2. The plane 4 can be set to a position between the intermediate plane, which is a virtual plane located at an equidistance from the front surface 1 and the back surface 2, and the front surface 1 or, for example, to a position of T/4 from the front surface 1. The pixel isolating portion 20 passes through the plane 4, whereas the pixel isolating portion 30 does not pass through the plane 4. The end 29 of the pixel isolating portion 20 on the side on the front surface 1 is located between the element isolating portion 10 and the plane 4, whereas the end 39 of the pixel isolating portion 30 on the side on the front surface 1 is located between the plane 3 and the plane 4.

In the present example, the pixel isolating portion 20 is connected to the element isolating portion 10. Therefore, the sum of the depth D1 of the element isolating portion 10 relative to the front surface 1 and the depth D2 of the pixel isolating portion 20 relative to the back surface 2 is equal to or greater than the thickness T of the semiconductor layer 100 (D1+D2≥T). The depth D3 of the pixel isolating portion 30 relative to the back surface 2 is smaller than the thickness T of the semiconductor layer 100 (D3<T). The depth D3 of the pixel isolating portion 30 may be approximately one-half the thickness T of the semiconductor layer 100 or, for example, may be in a range from ¼ to ¾ of the thickness T (T×¼≤D3≤T×¾).

The photoelectric conversion element PD is provided between the front surface 1 and the back surface 2 of the semiconductor layer 100. The photoelectric conversion element PD of the present example is a photodiode but may instead be a photogate or the like. The photoelectric conversion element PD, serving as a photodiode, includes an n-type impurity region 40 that functions as an accumulation region for accumulating signal charges (electrons) and a p-type impurity region 50 that forms a pn junction with the impurity region 40. Electrons generated through photoelectric conversion in the p-type impurity region 50 are accumulated in the impurity region 40. The impurity region 40 may be located within the plane 3. The impurity region 50 is located between the plane 3 and the back surface 2. Although an electron accumulating photodiode has been illustrated as an example, a hole accumulating photodiode can also be employed. In that case, the conductivity types of the impurity regions may be reversed from those of the electron accumulation type. The conductivity type in which the signal charges are the majority carrier is set as a first conductivity type, and the conductivity type in which the signal charges are the minority carrier is set as a second conductivity type. When the signal charges are electrons, an n-type in which the electrons are the majority carrier is the first conductivity type. It is to be noted that a portion that is regarded as the photoelectric conversion element PD in the semiconductor layer 100 is a portion that generates electric charges to be read out as the signal charges through photoelectric conversion. In a strict sense, the portion that is regarded as the photoelectric conversion element PD is determined by an impurity concentration distribution in the semiconductor layer 100 and a potential profile that is based on an applied voltage.

A pixel transistor 90 is provided on a side of the front surface 1 of the semiconductor layer 100. FIGS. 1A and 1B illustrate a channel region 70 and a gate electrode 80 of the pixel transistor 90. The pixel transistor 90 includes a transfer transistor, an amplification transistor, a reset transistor, and a selection transistor. The transfer transistor transfers the signal charges of the photoelectric conversion element PD to an electric charge detection region. The electric charge detection region is constituted by a floating diffusion region (floating diffusion). The amplification transistor generates a signal based on an electric charge with a source follower circuit and includes a gate connected to the electric charge detection region. The reset transistor includes a drain connected to the electric charge detection region and resets the electric charge of the photoelectric conversion element PD. The selection transistor selects between connection and disconnection of the amplification transistor and an output wire.

A portion of the semiconductor layer 100 that is outside the photoelectric conversion element PD is constituted by a p-type impurity region 60. The p-type impurity region 60 has a higher impurity concentration than the impurity region 50, which is also of a p-type. A portion of the impurity region 60 may function as a potential barrier that suppresses mixing of electric charges between the pixels. In addition, a portion of the impurity region 60 may function as a potential barrier that prevents a noise electric charge generated at an interface between the semiconductor layer 100 and the insulator 12 from being taken into the photoelectric conversion element PD. The impurity region 60 includes a dense p-type well contact to which a conductive member that supplies a fixed potential such as a ground potential is connected. A potential is supplied to the impurity region 50 of the photoelectric conversion element PD from the well contact via the impurity region 60.

The pixel isolating portions 20 and 30 are disposed so as to surround the photoelectric conversion element PD. The pixel isolating portions 20 and 30 have configurations that make it possible to suppress color mixing between neighboring pixels.

An insulating film 300 constituted by a plurality of wiring layers 310, 320, and 330 and a plurality of interlayer insulating layers surrounding the wiring layers 310, 320, and 330 is provided on a side of the front surface 1. Output wires constituted by the wiring layers 310, 320, and 330 are provided so as to output the signal charges generated by the photoelectric conversion element PD to a following stage in the form of electric signals via the pixel transistor 90.

In the back-side illuminated imaging apparatus illustrated in FIG. 1A, a dielectric film 410, a light blocking member 420, a color filter array 430, and a microlens array 440 are provided on a side of the back surface 2. The dielectric film 410 functions as a protective film (passivation film), a planarizing film, and or an antireflection film. A supporting substrate 400 is provided on the insulating film 300 on a side of the front surface 1. An integrated circuit such as a signal processing circuit can be provided on the supporting substrate 400. The semiconductor layer 100 has a thickness of approximately 1 μm to 10 μm. The supporting substrate 400 has a thickness of approximately 50 μm to 800 μm.

The color filter array 430 is provided so as to selectively transmit only light at specific wavelengths. For example, color filters that transmit light at wavelengths of red, green, and blue may be arrayed. In addition, a pixel that transmits white light may be mixed therein. Each of the microlenses of the microlens array 440 that are disposed so as to correspond to the respective pixels is provided to condense the incident light onto the photoelectric conversion element PD.

As illustrated in FIG. 1B, the semiconductor layer 100 includes element regions defined by the element isolating portion 10. The element regions are distinguished by their positions with respect to the element isolating portion 10. The lower ends of the element regions in the depthwise direction coincide with the bottom surface of the element isolating portion 10 having the depth D1. FIG. 1B illustrates element regions 111, 112, 113, and 114 as the element regions included in the semiconductor layer 100. An n-type impurity region 41 that serves as an accumulation region of a photoelectric conversion element PD1 is provided in the element region 111, and an n-type impurity region 42 that serves as an accumulation region of a photoelectric conversion element PD2 is provided in the element region 112. The element region 113 is disposed between the element region 111 and the element region 112, and semiconductor elements such as a transistor, a capacitative element, and a resistive element are provided in the element region 113. The shape of the element region 113 differs from the shape of the element region 111 or of the element region 112. The reason for this is that semiconductor elements other than the photoelectric conversion element PD, such as a transistor, are provided in the element region 113. Typically, the area of the element region 113 is smaller than the area of the element region 111 or of the element region 112.

In the present example, a pixel transistor is provided as a semiconductor element in the element region 113 described above. A typical pixel transistor may be a metal oxide semiconductor (MOS) transistor. Although a channel region 70 is illustrated in FIG. 1B as an impurity region of the pixel transistor, which is a MOS transistor, a source region and a drain region (not illustrated) are also provided in the element region 113. A gate electrode 80 of the pixel transistor is provided on the channel region 70. In the element region 114, an n-type impurity region 43 that serves as an accumulation region of a photoelectric conversion element PD3 is provided. It is to be noted that the regions that are indicated as the photoelectric conversion elements PD1, PD2, and PD3 in FIG. 1B correspond to the n-type impurity region 40, which serves as an accumulation region of the photoelectric conversion element PD, in FIG. 1A. Impurity regions corresponding to the p-type impurity region 50 that form the photoelectric conversion elements are present outside the regions indicated as the impurity regions 41, 42, and 43 in FIG. 1B.

The element isolating portion 10 includes isolating regions 101, 102, and 103. The isolating region 101 is located between the element region 111 and the element region 113. The isolating region 102 is located between the element region 112 and the element region 113. The isolating region 103 is located between the element region 111 and the element region 114.

The semiconductor layer 100 includes, on a side on the back surface 2 from the element isolating portion 10, semiconductor regions corresponding to the distribution of the element regions and the isolating regions on a side of the front surface 1. The semiconductor regions on a side on the back surface 2 are distinguished by their positions with respect to the isolating regions of the element isolating portion 10 or with respect to the element regions. Each of the semiconductor regions is located between one of the isolating regions of the element isolating portion 10 or one of the element regions of the semiconductor layer 100 and the back surface 2 in the normal direction N. As such semiconductor regions, the semiconductor layer 100 includes semiconductor regions 121, 122, 123, 124, 125, 126, and 127. The semiconductor region 121 is located between the element region 111 and the back surface 2, the semiconductor region 122 is located between the element region 112 and the back surface 2, and the semiconductor region 123 is located between the element region 113 and the back surface 2. The semiconductor region 127 is located between the element region 114 and the back surface 2. The semiconductor region 124 is located between the isolating region 101 and the back surface 2, the semiconductor region 125 is located between the isolating region 102 and the back surface 2, and the semiconductor region 126 is located between the isolating region 103 and the back surface 2. In the following description, the term "semiconductor region" refers to a position associated with an isolating region or an element region as described above. Meanwhile, a region distinguished by a predetermined conductivity type, an impurity type, and an impurity concentration for an operation of a semiconductor element in the semiconductor layer 100 is described as an "impurity region."

The pixel isolating portion 20 overlaps the isolating region 103 in the normal direction N. The pixel isolating portion 20 is constituted by the groove 21. The pixel isolating portion 20 is located between the semiconductor region 121 and the semiconductor region 127 in the in-plane direction P. The semiconductor region 126 is divided into a plurality of parts by the pixel isolating portion 20. As a result, the semiconductor region 126 includes a part 1261 located between the pixel isolating portion 20 and the semiconductor region 121 and a part 1262 located between the pixel isolating portion 20 and the semiconductor region 127. In the present example, the pixel isolating portion 20 is connected to the isolating region 103. In addition, in the present example, the pixel isolating portion 20 extends to the back surface 2. In other words, the groove 21, which constitutes the pixel isolating portion 20, is continuous with the back surface 2. In a case in which the pixel isolating portion 20 and the isolating region 103 are to be spaced apart from each other, a portion of the semiconductor region 126 is disposed between the pixel isolating portion 20 and the isolating region 103. In a case in which the pixel isolating portion 20 and the back surface 2 are to be spaced apart from each other, a portion of the semiconductor region 126 is disposed between the pixel isolating portion 20 and the back surface 2. It suffices that at least a portion of the pixel isolating portion 20 in the in-plane direction P have a part that overlaps the element isolating portion 10 in the normal direction N. A portion of the pixel isolating portion 20 in the in-plane direction P may have a part that does not overlap the element isolating portion 10 in the normal direction N.

The pixel isolating portion 30 overlaps the intermediate region 110 between the element region 111 and the element region 112 in the normal direction N. The intermediate region 110 between the element region 111 and the element region 112 includes the isolating region 101, the isolating region 102, and the element region 113, and the pixel isolating portion 30 overlaps the element region 113 in the present example. The pixel isolating portion 30 may overlap the isolating region 101 and/or the isolating region 102 in the normal direction N. The pixel isolating portion 30 does not have to overlap the element region 113 in the normal direction N. In this manner, the pixel isolating portion 30 may have a part that does not overlap the element isolating portion 10 in the normal direction N.

The pixel isolating portion 30 is constituted by the groove 31. The pixel isolating portion 30 is located between the semiconductor region 121 and the semiconductor region 122 in the in-plane direction P. The pixel isolating portion 30 that overlaps the element region 113 is located between the semiconductor region 124 and the semiconductor region 125 in the in-plane direction P. The semiconductor region 123 is divided into a plurality of parts by the pixel isolating portion 30. As a result, the semiconductor region 123 includes a part 1231 located between the pixel isolating portion 30 and the semiconductor region 121 and a part 1232 located between the pixel isolating portion 30 and the semiconductor region 122.

In this manner, the semiconductor region 121 and the semiconductor region 127 are discontinuous within the plane 3 due to the pixel isolating portion 20. In addition, the semiconductor region 121 and the semiconductor region 122 are discontinuous due to the pixel isolating portion 30. With this configuration, mixing of light between the pixels is reduced, and the optical characteristics of the photoelectric conversion apparatus improve. In addition, mixing of electric charges between the pixels is reduced, and the electrical characteristics of the photoelectric conversion apparatus improve.

The pixel isolating portion 30 is spaced apart from a region between the element region 111 and the element region 112, or in other words, spaced apart from the isolating region 101, the isolating region 102, and the element region 113. This configuration makes it possible to reduce noise that could be generated in the pixel transistor 90 in association with the pixel isolating portion 30. In addition, the above-described configuration makes it possible to reduce an influence on an operation of the pixel transistor 90 that could arise in the vicinity of the isolating region 101, the isolating region 102, and the element region 113 or arise due to stress concentration. Furthermore, the above-described configuration makes it possible to suppress an occurrence of a lattice defect (e.g., dislocation) in the semiconductor layer 100 that could be caused by stress concentration and thus to reduce a dark current to be taken into the photoelectric conversion element PD.

In particular, the channel region 70 is located under the gate electrode 80 of the pixel transistor 90. The channel region 70 is more sensitive to noise than the source and drain regions of the transistor. Therefore, the pixel isolating portion 30, which is shallower than the pixel isolating portion 20, may be disposed so as to overlap the channel region 70 or the gate electrode 80. In particular, it is effective that the pixel isolating portion 30 is not in contact with at least the gate insulating film of the pixel transistor 90. In addition, the pixel isolating portion 30 may be provided with a first part that is shallower than the pixel isolating portion 20 and a second part that is shallower than the first part. In other words, an end of the second part on the side on the front surface 1 is located closer to the back surface 2 than an end of the first part on the side on the front surface 1 is. Then, the second part may overlap the channel region 70 or the gate electrode 80, and the first part may overlap another region, such as the source or drain region.

It is desirable that a dense p-type impurity region be provided for providing isolation between the pixel isolating portion 30 and the photoelectric conversion element PD. Here, if the pixel isolating portion 30 is disposed underneath the isolating region 101 or the isolating region 102, the size of the photoelectric conversion element PD is limited by the amount corresponding to this dense p-type impurity region. Thus, disposing the pixel isolating portion 30 underneath the element region 113 makes it possible to increase the size of the photoelectric conversion element PD.

Furthermore, the semiconductor region 124 and the semiconductor region 125 that are adjacent to the semiconductor region 123 can also be used as the photoelectric conversion element PD. If the pixel isolating portion 20 is disposed in the semiconductor region 124, the pixel isolating portion 20 prevents an electric charge from moving between the semiconductor region 123 and the semiconductor region 121. This makes it difficult to effectively use the semiconductor region 123 as the photoelectric conversion element PD. In this manner, disposing the pixel isolating portion 30 underneath the element region 113 makes it possible to extend the photoelectric conversion element PD1 from the semiconductor region 121 to the semiconductor region 124. In addition, the above-described configuration makes it possible to extend the photoelectric conversion element PD2 from the semiconductor region 122 to the semiconductor region 125. With this configuration, the sensitivity can be improved.

The pixel isolating portion 20 is not provided between the isolating region 101 and the back surface 2. Therefore, the semiconductor region 121 and the semiconductor region 123 are continuous with each other with the semiconductor region 124 interposed therebetween in the plane 3. In other words, the semiconductor layer 100 is continuous underneath the element region 111, the element region 113, and the isolating region 101 in the plane 3. In this manner, the semiconductor layer 100 is continuous underneath the isolating region 101 as the pixel isolating portion 20 is not provided therein. Thus, scattering of light by the groove 21 of the pixel isolating portion 20 is suppressed. Therefore, the quantity of light incident on the photoelectric conversion element PD can be increased, and the sensitivity thus improves. In addition, as the pixel isolating portion 20, which can be a noise source, is disposed away from the impurity region 40, which serves as an accumulation region of the photoelectric conversion element PD, noise generated in the vicinity of the pixel isolating portion 20 can be prevented from being taken into the photoelectric conversion element PD. Furthermore, not only the element region 111 and the semiconductor region 121 but the semiconductor region 124 can also be used for the photoelectric conversion element PD. If the pixel isolating portion 20 is disposed in the semiconductor region 124, the volume of the photoelectric conversion element PD is reduced by the amount corresponding to the volume of the pixel isolating portion 20, and thus the sensitivity decreases.

In the example illustrated in FIG. 1A, the photoelectric conversion element PD is disposed so as to extend into a region corresponding to the semiconductor regions 123 and 124 in FIG. 1B. This configuration makes it easier to make the center of the photoelectric conversion element PD coincide with or be brought closer to the focus position of the microlens (typically, the optical axis of the microlens). In order to bring the focus position of the microlens closer to the center of the photodiode, the distance between the optical axis of the microlens and the isolating region 101 may be made smaller than the distance between the optical axis of the microlens and the isolating region 103. Such a configuration makes it possible to condense the light by the microlens at a position that is substantially equidistant from the pixel isolating portions 20 and 30.

Figure 2A:
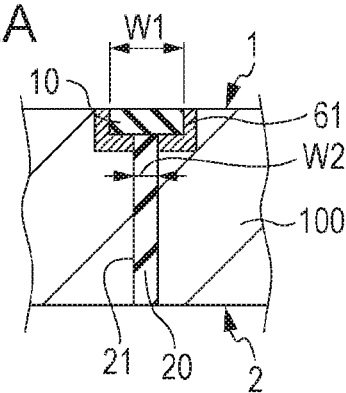
FIGS. 2A-2H are schematic diagrams for describing a photoelectric conversion apparatus.

FIGS. 2A through 2D illustrate modifications of the pixel isolating portion 20 connected to the element isolating portion 10. As illustrated in FIG. 2A, a dense p-type impurity region 61 for a p-type channel stop can be provided so as to surround the element isolating portion 10. It is desirable that the pixel isolating portion 20 be provided such that the bottom portion thereof is in contact with the impurity region 61. This configuration makes it possible to suppress a problem such as a dark current associated with a lattice defect in the vicinity of the bottom portion of the pixel isolating portion 20 in a similar manner to the element isolating portion 10.

Figure 2B:
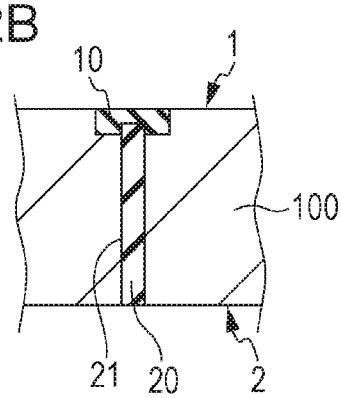

In addition, as illustrated in FIG. 2B, the pixel isolating portion 20 may be disposed such that the bottom portion of the pixel isolating portion 20 penetrates into the bottom portion of the element isolating portion 10. This configuration makes it possible to keep the interface between the element isolating portion 10 and the pixel isolating portion 20 away from the semiconductor layer 100, and thus a lattice defect that could arise around the bottom portion of the pixel isolating portion 20 can be suppressed.

In addition, as illustrated in FIGS. 2A and 2B, the width W1 of the isolating region of the element isolating portion 10 to which the pixel isolating portion 20 is connected may be greater than the width W2 of the pixel isolating portion 20 (W1>W2). With this configuration, even when an alignment shift occurs, it becomes easier to connect the bottom portion of the pixel isolating portion 20 to the bottom portion of the element isolating portion 10.

Figure 2C:
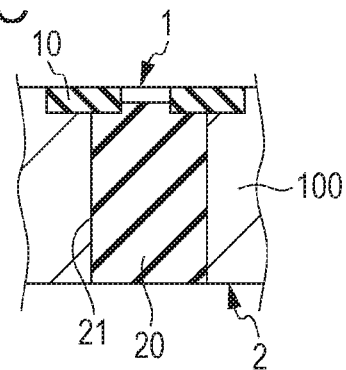
Figure 2D:
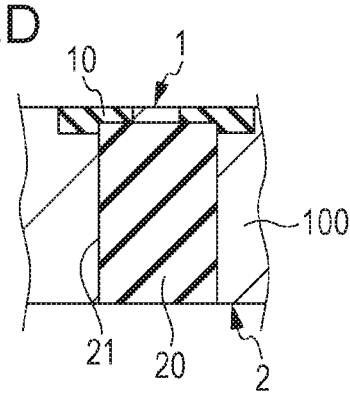

In addition, as illustrated in FIGS. 2C and 2D, a portion of the pixel isolating portion 20 may face an element region. Furthermore, as illustrated in FIGS. 2C and 2D, the pixel isolating portion 20 may be connected to both of the plurality of isolating regions that oppose each other with an element region interposed therebetween. FIGS. 2C and 2D illustrate a case in which a part of the pixel isolating portion 20 that faces the element region is located closer to the front surface 1 than the bottom surface of the element isolating portion 10 is. FIG. 2C illustrates a case in which a part of the pixel isolating portion 20 that faces the isolating regions is located closer to the back surface 2 than a part of the pixel isolating portion 20 that faces the element region is. FIG. 2D illustrates a case in which a part of the element isolating portion 10 that does not face the pixel isolating portion 20 is located closer to the back surface 2 than a part of the element isolating portion 10 that faces the pixel isolating portion 20 is.

Figure 2E:
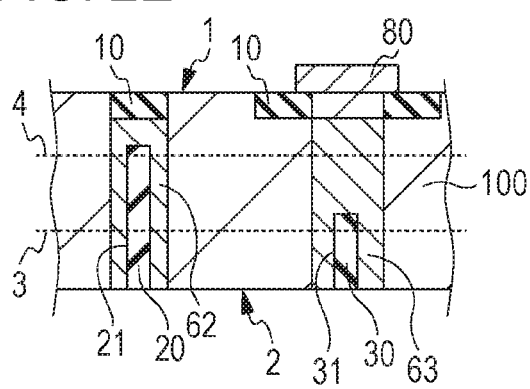
Figure 2F:
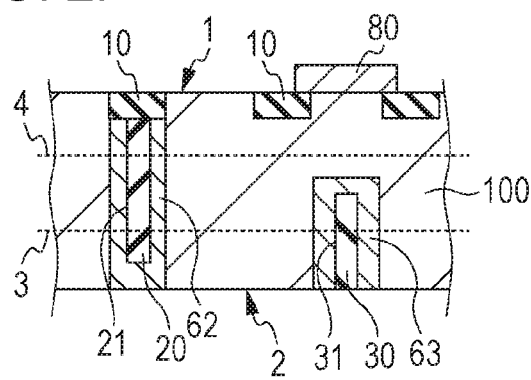

As illustrated in FIGS. 2E and 2F, a dense p-type impurity region 62 can be provided so as to surround the pixel isolating portion 20 for preventing an electric charge that leads to noise from being mixed into the semiconductor element from the pixel isolating portion 20. In a similar manner, a dense p-type impurity region 62 can be provided so as to surround the pixel isolating portion 20 for preventing an electric charge that leads to noise from being mixed into the semiconductor element from the pixel isolating portion 20. In a similar manner, a dense p-type impurity region 63 can be provided so as to surround the pixel isolating portion 30 for preventing an electric charge that leads to noise from being mixed into the semiconductor element from the pixel isolating portion 30. As illustrated in FIG. 2E, the positions at which the impurity region 62 and the impurity region 63 are provided may be the same regardless of the difference in the depth between the pixel isolating portions 20 and 30. In FIG. 2E, the impurity region 62 and the impurity region 63 are provided so as to extend to substantially the bottom portion of the element isolating portion 10. In addition, as illustrated in FIG. 2E, the positions at which the impurity region 62 and the impurity region 63 are provided may be different from each other in accordance with the difference in the depth between the pixel isolating portions 20 and 30. In FIG. 2E, the impurity region 62 surrounding the pixel isolating portion 20, which is deeper than the pixel isolating portion 30 relative to the back surface 2, is provided to a position deeper from the back surface 2 than that of the impurity region 63 surrounding the pixel isolating portion 30, which is shallower than the pixel isolating portion 20 relative to the back surface 2. It is to be noted that the dense p-type impurity regions 62 and 63 may be continuous with the dense p-type impurity region 61 illustrated in FIG. 2A or may be integrated with the dense p-type impurity region 61.

FIG. 2E illustrates a case in which the pixel isolating portion 20 is not connected to the element isolating portion 10. FIG. 2F illustrates a case in which the pixel isolating portion 20 does not reach the back surface 2. In either of the cases illustrated in FIGS. 2E and 2F, the pixel isolating portion 20 and the pixel isolating portion 30 pass through the plane 3, the pixel isolating portion 20 passes through the plane 4, and the pixel isolating portion 30 does not pass through the plane 4.

Figure 2G:
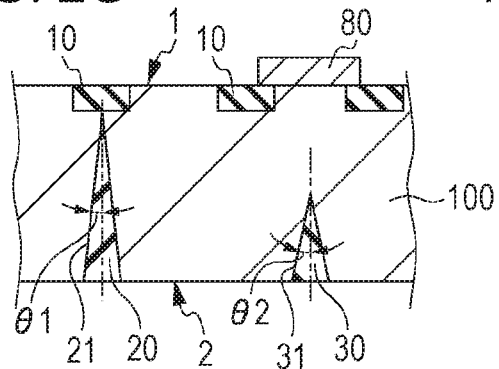

As illustrated in FIG. 2G, the groove 21 and the groove 31, respectively, in the pixel isolating portion 20 and the pixel isolating portion 30, which differ in depth, may have side surfaces with different angles of inclination. For example, the angle θ1 of inclination of the side surface of the groove 21 in the deeper pixel isolating portion 20 is made smaller than the angle θ2 of inclination of the side surface of the groove 31 in the shallower pixel isolating portion 30 (θ1<θ2). In addition, the grooves 21 and 31 are made narrower toward the front surface 1. In this manner, in a region around the pixel isolating portion 30 in which there is a concern for an influence of a lattice defect or stress concentration on the operation of the transistor, the influence on the operation of the transistor can be suppress by reducing the volume of the pixel isolating portion 30.

Figure 2H:
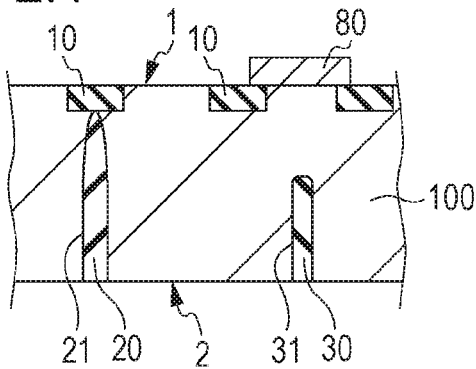

Alternatively, as illustrated in FIG. 2H, the bottom portions of the pixel isolating portion 20 and the pixel isolating portion 30, which differ in depth, may have different curvatures. For example, the curvature of the bottom surface of the groove 21 in the deeper pixel isolating portion 20 is made larger than the curvature of the bottom surface of the groove 31 in the shallower pixel isolating portion 30. By making the curvature of the bottom surface of the groove 31 in the pixel isolating portion 30 smaller, local stress can be relieved. In a case in which the curvature of the bottom surface of the groove 21 in the pixel isolating portion 20 is large, the leading end of the pixel isolating portion 20 may penetrate into the element isolating portion 10, as illustrated in FIG. 2H.

It is to be noted that the shape of the pixel isolating portion 20 is not limited to what is indicated in the present exemplary embodiment, and any well-known trench shape can be used, as appropriate. For example, the pixel isolating portion 20 may be forward tapered or backward tapered from the back surface 2 of the semiconductor layer 100 toward the front surface 1. Alternatively, a structure that includes a plurality of angles of inclination may be employed. Adjusting the shapes of the pixel isolating portions 20 and 30 in this manner makes it possible to suppress color mixing between the pixels, to improve the sensitivity, or to reduce noise.

Hereinafter, examples of the layout in the pixel region PX will be described with reference to FIGS. 3 and 4. In the following examples, the in-plane direction P described above is divided into the X-direction and the Y-direction that intersect with (are orthogonal to) each other. In addition, the normal direction N is referred to as the Z-direction that intersects with (is orthogonal to) the X-direction and the Y-direction. The layout along the X-Y plane in FIGS. 3 and 4 shows a perspective of the semiconductor layer 100, the element isolating portion 10, and the pixel isolating portions 20 and 30 as viewed from the side of the back surface 2.

Therefore, a portion in which the element isolating portion 10 and the pixel isolating portion 20 or 30 overlap each other is indicated by overlaying the hatching for the element isolating portion 10 and the hatching for the pixel isolating portion 20 or 30.

A first example of the layout of the pixels will be described with reference to FIG. 3. The pixel isolating portions disposed in a lattice pattern are formed such that the depth thereof differs in the X-direction and the Y-direction. In other words, the deeper pixel isolating portions 20 extend in the X-direction, and the shallower pixel isolating portions 30 extend in the Y-direction.

Figure 3:
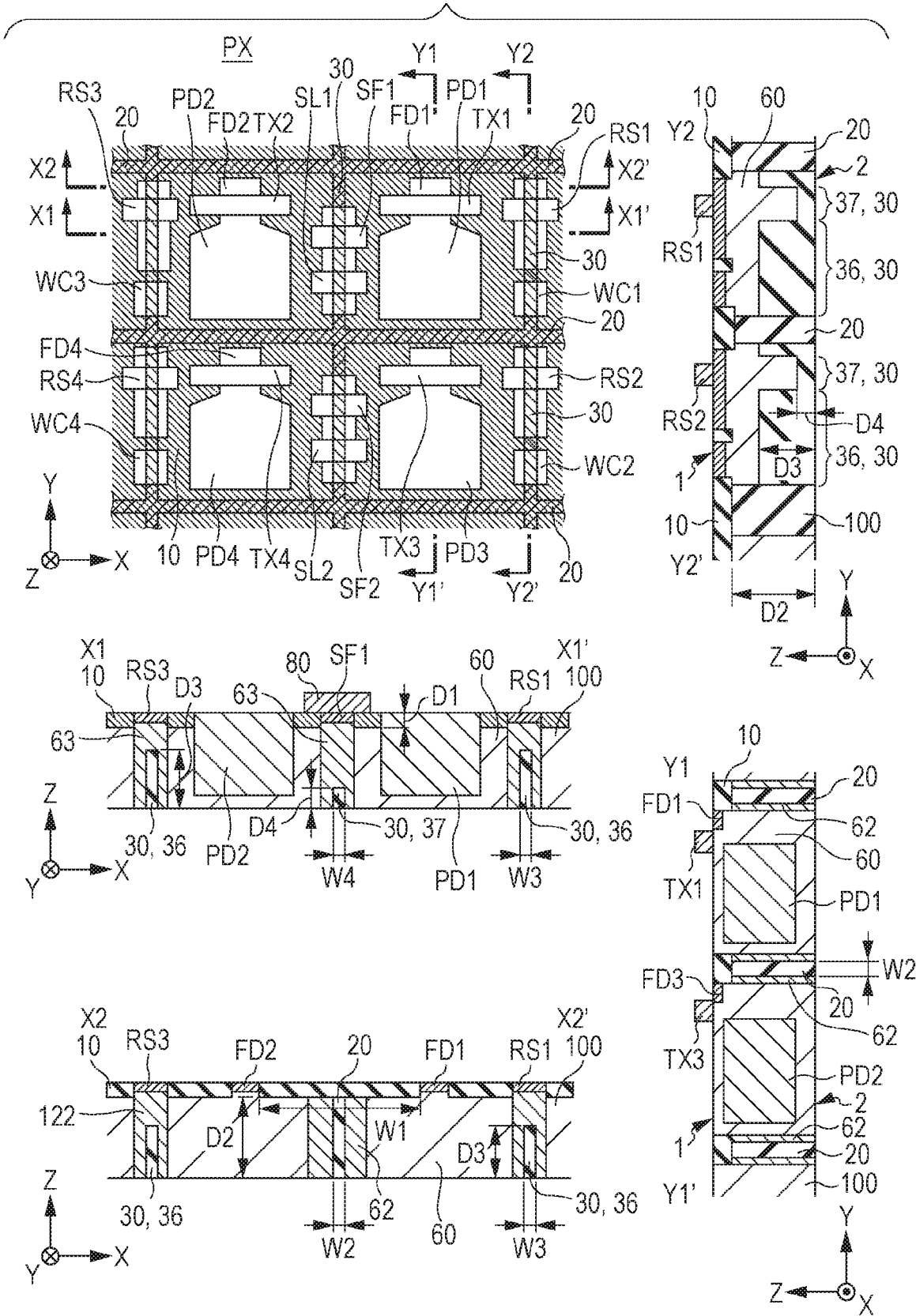
FIG. 3 is a schematic diagram for describing a photoelectric conversion apparatus.

FIG. 3 illustrates element regions of four types of shapes. In an element region of a first type, a photodiode PDm, a transfer gate TXm, and a floating diffusion FDm are disposed. In an element region of a second type, a reset transistor RSn is disposed. In an element region of a third type, an amplification transistor SFn and a selection transistor SLn are disposed. In an element region of a fourth type, a well contact WCn is disposed. Here, m is a number determined for each of m pixels. In FIG. 3, with m=1 to 4, PD1, PD3, FD2, FD4, and so on are appended. In addition, n is a number determined for each of pixels. In FIG. 3, with n=1 or 2, RS1, RS2, SF1, SF2, and so on are appended. When m is odd, n=(m+1)/2 holds. When m is even, n=m/2 holds.

Upon the potential of the floating diffusion FDm being reset by the reset transistor RSn, an electric charge from the photodiode PDm is transferred to the floating diffusion FDm via the transfer gate TXm. The potential change in the floating diffusion FDm is transmitted to the gate of the amplification transistor SFn through a wire (not illustrated). The signal amplified by the amplification transistor SFn that constitutes a source follower circuit is read out successively to an output signal line (not illustrated) via the selection transistor SLn. In other words, the operations of photoelectric conversion, accumulation, electric charge detection, amplification, and pixel selection are carried out within a single pixel. In addition, the well contact WCn controls the potential of a well region of the pixel. The plurality of photodiodes PDm share the reset transistor RSn, the amplification transistor SFn, and the selection transistor SLn. With regard to the sharing relationship at this time, n=(m+1)/2 is satisfied when m is odd, and n=m/2 is satisfied when m is even.

A pixel transistor does not have to be shared by a plurality of photodiodes, and a pixel transistor may be disposed in each of the pixels. In addition, signals may be read out separately from a plurality of photodiodes PD for a single pixel, and these signals may be combined. In this manner, light rays obtained through pupil division by the plurality of photodiodes PD of one pixel can be detected separately, and the range finding or focal point detection through a phase difference detection method can be carried out. In addition, by combining the signals obtained with the sensitivities of the plurality of photodiodes PDp of one pixel made to differ from one another, the dynamic range can be broadened.

The photodiode PD1 and the photodiode PD2 are arrayed in the X-direction. The photodiode PD1 and the photodiode PD3 are arrayed in the Y-direction. The element region in which the photodiode PD3 is disposed is adjacent to the element region in which the photodiode PD1 is disposed. Here, that two element regions are adjacent to each other means that no element region is present between the two element regions. The element region in which the photodiode PD1 is disposed corresponds to the element region 111 described with reference to FIG. 1B, and the element region in which the photodiode PD2 is disposed corresponds to the element region 112 described with reference to FIG. 1B. The element region in which the amplification transistor SFn and the selection transistor SLn are disposed corresponds to the element region 113 described with reference to FIG. 1B. The element region in which the photodiode PD3 is disposed corresponds to the element region 114 described with reference to FIG. 1B.

The element isolating portion 10 includes the isolating region 103 disposed between the element region in which the photodiode PD1 is disposed and the element region in which the photodiode PD3 is disposed. The pixel isolating portion 20 overlaps the isolating region 103 in the Z-direction.

In addition, the pixel isolating portion 30 is provided with a first part 36, which is shallower than the pixel isolating portion 20, and a second part 37, which is shallower than the first part 36. In other words, the end of the second part 37 on the side on the front surface 1 is located closer to the back surface 2 than the end of the first part 36 on the side on the front surface 1 is. In addition, the second part 37 may overlap the channel region 70 or the gate electrode 80, the first part 36 may overlap another region, such as the source or drain region.

The second part 37, which is the shallower portion of the pixel isolating portion 30, is provided underneath the channel region in which there is a concern for an influence on the operation of the pixel transistor. The first part 36 of the pixel isolating portion 30 is provided deeper underneath the channel region below the source and drain regions, but the pixel isolating portion 30 can be provided shallower than the other pixel isolating portion 30 (first part 36) underneath the source and drain regions. The depths of the pixel isolating portions 20 and 30 may be made to differ continuously along the lengthwise direction thereof in accordance with the structure of the semiconductor layer 100 on the side of the front surface 1. In this case, the widths of the pixel isolating portions 20 and 30 may be made to differ continuously along the lengthwise direction of the pixel isolating portions 20 and 30. In addition, it is desirable that a change in the linewidth or in the depth be made gentle at a portion at which such a change occurs in the pixel isolating portions 20 and 30.

A second example of the layout of the pixels will be described with reference to FIG. 4. As illustrated in FIG. 4, the element isolating portion 10, which is formed of silicon oxide, is provided between an element region in which a plurality of photodiodes PDn (n=1 to 4) are provided and a surrounding element region in which a pixel transistor is provided. The element isolating portion 10 is not provided between adjacent photodiodes PDn. Although not illustrated, isolation by a dense p-type impurity region 63 through ion implantation is formed between adjacent photodiodes PDn.

As in the plan view illustrated in FIG. 4, the width of the pixel isolating portion at a position facing the pixel isolating portion 10 is locally increased, and the width of the pixel isolating portion is relatively decreased in other regions. The pixel isolating portion with a relatively greater width can be formed deeper.

The width W2 of the deeper pixel isolating portion 20 in contact with the element isolating portion 10 on the side of the front surface 1 of the semiconductor layer 100 is greater than the width W3 of the shallower pixel isolating portion 30 having the depth D3 extending midway in the semiconductor layer 100 (W2>W3). In addition, the width is made to differ in accordance with the difference in depth also in the pixel isolating portion 30 having a depth extending midway in the semiconductor layer 100. In other words, the width W3 of the first part 36 of the pixel isolating portion 30 having the depth D3 is greater than the width W4 of the second part 37 of the pixel isolating portion 30 having the depth D4, which is smaller than the depth D3 (W3>W4). In this manner, the width of the pixel isolating portion can be made smaller as the depth of the pixel isolating portion decreases. Here, in a case in which the widths of the pixel isolating portions 20 and 30 vary in the Z-direction (the thickness direction of the semiconductor layer 100), the widths of the pixel isolating portions 20 and 30 within the third plane 3 can be employed as representative widths. Both the pixel isolating portion 20 and the pixel isolating portion 30 are present within the third plane 3, and thus the widths thereof can be compared with ease.

According to the present exemplary embodiment described above, even in a case in which the pixel isolating portions 20 and 30 surround the region that includes two adjacent photodiodes, the depths of the pixel isolating portions 20 and 30 are made to differ from each other in accordance with the structure of the semiconductor layer 100 on the side of the front surface 1. This configuration makes it possible to suppress an influence on the photoelectric conversion characteristics or the characteristics of the transistors and to effectively suppress color mixing between neighboring pixels.

Next, with reference to FIGS. 5A through 5H, a method of manufacturing a solid-state imaging apparatus according to the present exemplary embodiment will be described.

Figure 5A:
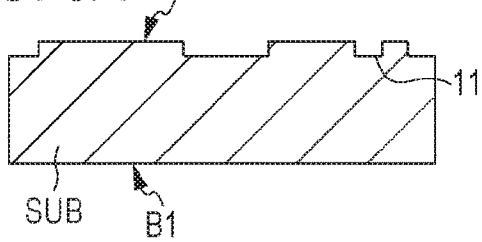
FIGS. 5A-5H are schematic diagrams for describing a method of manufacturing a photoelectric conversion apparatus.

First, in step a illustrated in FIG. 5A, a groove 11 for an element isolating portion 10 is formed in a front surface F of a semiconductor substrate SUB. A channel stop layer (not illustrated) is formed around the groove 11 through ion implantation.

Figure 5B:
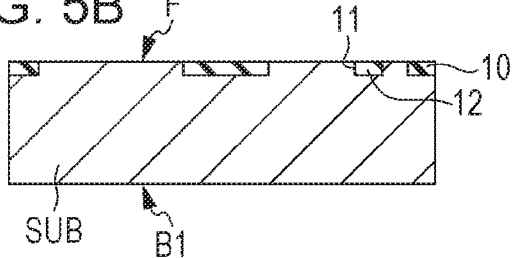

Next, in step b illustrated in FIG. 5B, an insulator 12 for the element isolating portion 10 is buried into the groove 11. Silicon oxide is suitable for the insulator 12. Excess insulator outside the groove 11 is removed through chemical mechanical polishing (CMP) or the like. Thus, the element isolating portion 10 having an STI (shallow trench isolation) structure is formed.

Figure 5C:
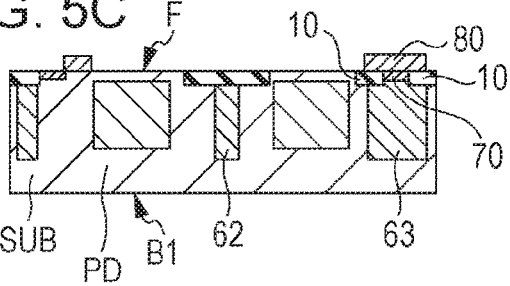

Next, in step c illustrated in FIG. 5C, a gate insulating film (not illustrated) and a gate electrode 80 are laminated on the front surface F of the semiconductor substrate SUB, and a pixel transistor (not illustrated) is thus formed. Furthermore, a photoelectric conversion element PD and the source and drain regions of the pixel transistor are formed through ion implantation carried out from the side of the front surface F of the semiconductor substrate SUB. In addition, in the semiconductor region in which pixel isolating portions 20 and 30 are to be formed, impurity regions 62 and 63 can be formed in this step.

Figure 5D:
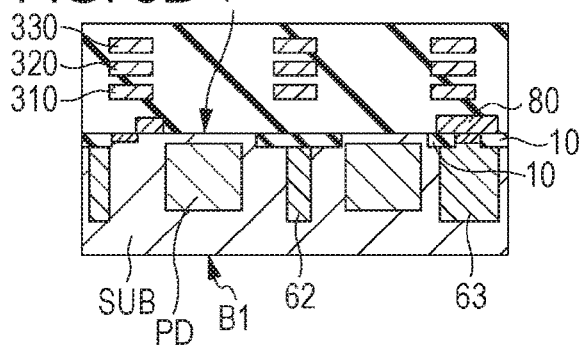

Next, in step d illustrated in FIG. 5D, an insulating layer that covers the gate electrode 80 is laminated, and then a contact hole is formed in the insulating layer. Furthermore, a wiring layer and an interlayer insulating layer are laminated on the insulating layer in which the contact hole has been formed, and thus a multilayer wiring structure is formed. In the present example, three wiring layers 310, 320, and 330 are formed. For example, a copper wire or an aluminum wire can be used for the wiring structure.

Figure 5E:
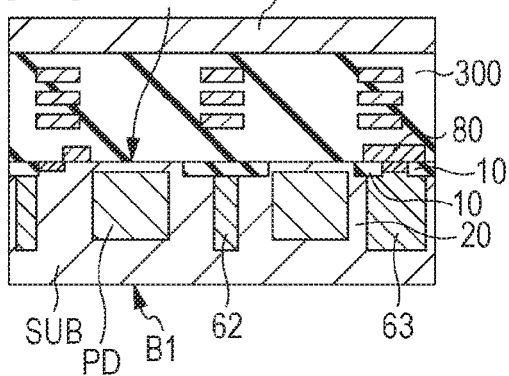

Next, in step e illustrated in FIG. 5E, a supporting substrate 400 is affixed onto an insulating film 300 from the above. The supporting substrate 400 may be affixed through bonding with an adhesive or through other well-known methods, as appropriate. However, it is preferable that the affixing be processed at a temperature of no greater than 400° C. so that the wiring structure is not affected.

Figure 5F:
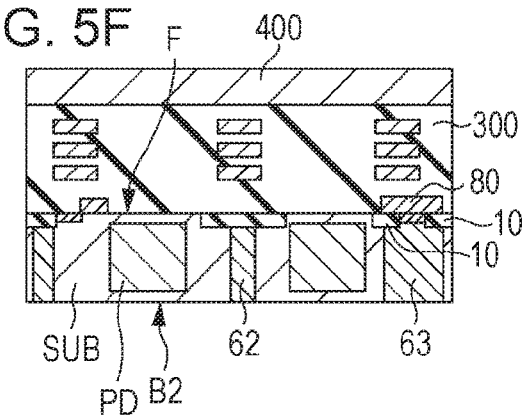

Next, in step f illustrated in FIG. 5F, thinning processing is carried out from the side of a back surface B1 of the semiconductor substrate SUB until the semiconductor substrate SUB has a desired thickness. The thinning of the semiconductor substrate SUB produces a new back surface B2 in place of the back surface B1. The photoelectric conversion element PD may be made to border on the back surface B2. For example, chemical mechanical polishing (CMP), dry etching, wet etching, or the like can be used. Alternatively, these techniques can be combined. For example, the film thickness of the thinned semiconductor substrate SUB may be in a range of from 1 μm to 10 μm, and it is preferable that the film thickness be in a range of from 2 μm to 5 μm from the standpoint of improving the photo-receiving sensitivity of the photodiode or the mechanical strength of the semiconductor substrate SUB.

Figure 5G:
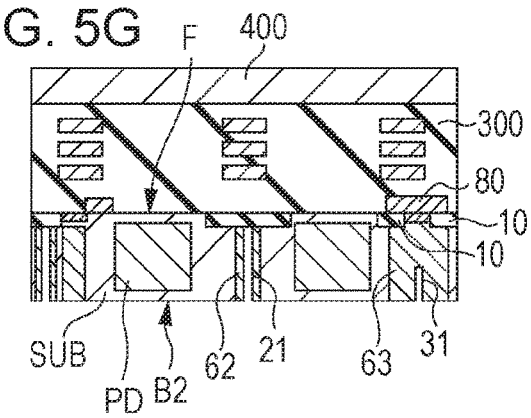

Next, in step g illustrated in FIG. 5G, a groove 21 for the pixel isolating portion 20 is formed in the back surface B2 of the semiconductor substrate SUB at a position that is opposite to the element isolating portion 10 formed on the side of the front surface F of the semiconductor substrate SUB. At this point, the depth of the groove 21 of the pixel isolating portion 20 with respect to the back surface B2 may be the depth by which the bottom portion of the pixel isolating portion 20 reaches the element isolating portion 10.

For example, if the depth of the element isolating portion 10 is approximately 0.3 μm when the thickness of the semiconductor substrate SUB that has been subjected to the thinning processing is approximately 2 μm, the groove 21 to be disposed opposite to the element isolating portion 10 is formed to have a depth of approximately 1.7 μm. Such a pixel isolating portion 20 is formed through the following procedures. Here, the width of the bottom portion of the pixel isolating portion 20 may be made smaller than the width of the bottom portion of the element isolating portion 10. With this configuration, even when an alignment shift occurs, it becomes easier to bring the bottom portion of the pixel isolating portion 20 in contact with the bottom portion of the element isolating portion 10.

The groove 21 of the pixel isolating portion 20 is not provided underneath the isolating region 101, which is a portion of the element isolating portion 10, adjacent to the photoelectric conversion element PD. This configuration makes it possible to improve the photoelectric conversion performance described above.

The method of forming the pixel isolating portion 20 will be described in further detail. First, in order to form the groove 21 of the pixel isolating portion 20 and a groove 31 of the pixel isolating portion 30 in the semiconductor substrate SUB, the grooves 21 and 31 each having a desired width is formed, for example, with the use of anisotropic dry etching. In etching silicon, the Bosch process in which a protective film forming step and an etching step are repeated every several seconds can also be used. When the groove 21 of the pixel isolating portion 20 is processed through dry etching, the element isolating portion 10 may be used to detect the terminal in the etching of the semiconductor substrate SUB. Alternatively, the etching may be carried out with the etching time specified in accordance with the film thickness of the semiconductor substrate SUB. In addition, a portion of the bottom portion of the element isolating portion 10 may be etched.

The grooves 21 and 31 that differ in depth can be formed at the same time by using the same etching mask (not illustrated). By etching the semiconductor substrate SUB under the etching condition that uses the microloading effect, the deeper groove 21 is formed under a wide aperture in the mask pattern of the etching mask, and the shallower groove 31 is formed under a narrow aperture. The microloading effect is a phenomenon in which the etching speed decreases as the aperture width decreases. By setting the mask pattern of the etching mask, the grooves with different depths can be formed in a simple process. The semiconductor substrate SUB can also be etched under the etching condition that uses the inverse microloading effect. In that case, the deeper groove 21 can be formed under a narrow aperture in the mask pattern of the etching mask, and the shallower groove 31 can be formed under a wide aperture. Of course, the deeper groove 21 and the shallower groove 31 can instead be formed separately in separate processes, but doing so leads to various disadvantages including an increase in the lithography processes and a mask residue that enters the deep groove 21.

Figure 5H:
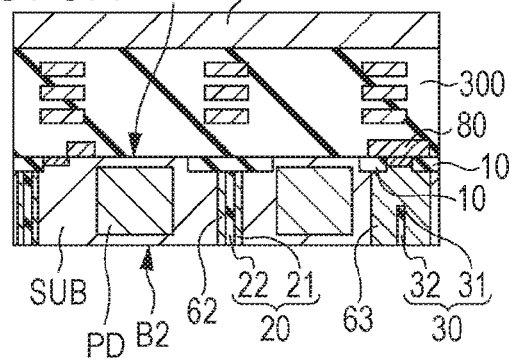

Next, in step h illustrated in FIG. 5H, solids 22 and 32 are formed in the grooves 21 and 31, respectively. First, a fixed electric charge film (not illustrated) for suppressing the dark current that could be generated in the back surface 2 of the semiconductor layer 100 is formed. Thus, a fixed electric charge film (not illustrated) is formed so as to follow the shape of the back surface B2 of the semiconductor substrate SUB. This fixed electric charge film is formed at least on the back surface B2 of the semiconductor substrate SUB and may further be formed so as to cover the side wall or the bottom surface of the groove 21 of the pixel isolating portion 20. By covering the side wall and the bottom surface of the pixel isolating portion 20 with the fixed electric charge film in this manner, a dark current that can be generated on the surface of the groove 21, for example, can also be suppressed. For the fixed electric charge film, for example, a hafnium oxide film formed through atomic layer deposition (ALD) can be used.

Next, the solid 22 made of a dielectric material, a metal material, a material with a light blocking property, or a combination of such materials is formed inside the pixel isolating portion 20 of the semiconductor substrate SUB. For example, a film of a material having a lower refractive index than silicon forming the semiconductor substrate SUB, such as a silicon oxide film or a titanium oxide film, is formed on the fixed electric charge film. Subsequently, a conductive material is buried with the use of chemical vapor deposition (CVD) or atomic layer deposition (ALD), and the pixel isolating portion 20 can thus be formed. Alternatively, a silicon oxide film is formed on the fixed electric charge film with the use of atomic layer deposition (ALD), and then another silicon oxide film is deposited thereon with the use of high density plasma (HDP) CVD. In this manner, the pixel isolating portion 20 may be formed by burying with a two-layer structure insulating film. In particular, a material that can be formed at a low temperature of no greater than 400° C. is preferable, and it is desirable that amorphous silicon doped with a P-type impurity, copper, tungsten, or the like be deposited through chemical vapor deposition (CVD) or atomic layer deposition (ALD). Here, the fixed electric charge film described above may be used as the solid 22.

Although an example in which the solid 22 is buried into the pixel isolating portion 20 has been described above, the structure of the inside of the groove 21 is not limited thereto, and any well-known structure and manufacturing method that can suppress color mixing can be employed. In addition, a portion or the entirety of the groove 21 of the pixel isolating portion 20 may be hollow, for example.

Although a case in which the pixel isolating portion 20 is formed from the side of the back surface B2 of the semiconductor substrate SUB has been described in the present example, the method of forming the pixel isolating portion 20 is not limited to the method described herein. For example, the groove 21 may be formed from the side of the front surface F of the semiconductor substrate SUB before the element isolating portion 10 is formed as described in steps a and b.

Thereafter, the structure illustrated in FIG. 1A is formed. The dielectric film 410 is formed on the side of the back surface B2 of the semiconductor substrate SUB, and the light blocking member 420 is patterned between the pixels on the dielectric film 410. The light blocking member 420 is formed through a process of removing a portion other than a portion that requires a light blocking structure including a portion between the pixels after the film deposition through sputtering or chemical vapor deposition (CVD). As the material for the light blocking member 420, for example, a laminated film of titanium and tungsten, a laminated film of titanium nitride and tungsten, or the like can be used.

Next, a planarizing film (not illustrated) is formed, the color filter array 430 of, for example, red, green, and blue corresponding to the respective pixels is formed on the planarizing film, and the microlens array 440 is formed on the color filter array 430. The color filters and the microlenses are formed so as to correspond to the respective pixels of the pixel array. With the method described above, the photoelectric conversion apparatus is completed. The semiconductor substrate SUB is used as the semiconductor layer 100 described above.

According to the exemplary embodiment described above, the deeper pixel isolating portion 20 and the shallower pixel isolating portion 30 coexist in the pixel region PX. By allowing the deeper pixel isolating portion 20 to extend in the depthwise direction to the element isolating portion 10, color mixing between the neighboring pixels can be suppressed effectively. In addition, an influence of noise or the like can be reduced also by disposing the shallower pixel isolating portion 30 underneath an element region in which a transistor and so on are provided or underneath an isolating region in which a lattice defect is likely to occur. This configuration makes it possible to dispose the pixel isolating portions 20 and 30 in the layout suitable for photoelectric conversion. Thus, the performance of the photoelectric conversion apparatus can be improved.

The photoelectric conversion apparatus described thus far can be applied to an imaging apparatus (image sensor) for use in a camera or the like. In addition, the photoelectric conversion apparatus can also be applied to a sensor for focus detection (AF: autofocus) or to a sensor for light metering (AE: auto-exposure). The camera can include, aside from the photoelectric conversion apparatus serving as an imaging apparatus, at least one of a signal processing device, a storage device, a display device, and an optical device. The signal processing device is, for example, a central processing unit (CPU) or a digital signal processor (DSP) and processes a signal obtained from the imaging apparatus. The storage device is, for example, a dynamic random-access memory (DRAM) or a flash memory and stores information that is based on a signal obtained from the imaging apparatus. The display device is, for example, a liquid crystal display or an organic electroluminescent (EL) display and displays information that is based on a signal obtained by the imaging apparatus. The optical device is, for example, a lens, a mirror, a shutter, or a filter and guides light to the imaging apparatus. The camera as used herein includes, aside from a camera dedicated apparatus such as a still camera, a video camera, and a surveillance camera, an information terminal provided with an imaging function and a moving body (vehicle, flying object, etc.) provided with an imaging function.

Even when there is no clear statement in the present specification, features that can be grasped from the appended drawings and common general technical knowledge constitute a portion of the present disclosure. The present disclosure can be modified as appropriate within the scope that does not depart from the technical spirit of the present disclosure.

According to the present disclosure, a photoelectric conversion apparatus with improved performance can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion apparatus including a pixel region having a plurality of photoelectric conversion elements, the photoelectric conversion apparatus comprising:

a semiconductor layer having a first surface and a second surface, the plurality of photoelectric conversion elements being disposed between the first surface and the second surface, wherein, in the pixel region, the semiconductor layer includes a first impurity region of a first conductivity type and a second impurity region of a second conductivity type, the first impurity region is a source region or a drain region of a MOS transistor, wherein, in the pixel region, a conductive member is arranged on the first surface, the conductive member forming a contact with the second impurity region, and configured to supply voltage to the second impurity region, wherein, in the pixel region, the semiconductor layer is provided with a groove, the groove continuing to the second surface, and wherein a part of the groove overlaps the contact in a direction perpendicular to the first surface.

2. The photoelectric conversion apparatus according to claim 1, wherein, in the pixel region, an element isolating portion is arranged on a side of the first surface, the element isolating portion being constituted by an insulator, and wherein at least a part of a gate electrode of the MOS transistor is arranged on the element isolating portion.

3. The photoelectric conversion apparatus according to claim 2, wherein, the element isolating portion has a shallow trench isolation structure.

4. The photoelectric conversion apparatus according to claim 2, wherein, a part of the insulator is arranged between the semiconductor layer and the gate electrode of the MOS transistor.

5. The photoelectric conversion apparatus according to claim 2, wherein, a part of the semiconductor layer is arranged between the insulator and a part of the groove.

6. A camera, comprising:
the photoelectric conversion apparatus according to claim 2; and
at least one of:
a signal processing device configured to process a signal output from the photoelectric conversion apparatus; a storage device configured to store information that is based on a signal output from the photoelectric conversion apparatus;
a display device configured to display information that is based on a signal output from the photoelectric conversion apparatus; and
an optical device configured guide light to the photoelectric conversion apparatus.

7. The photoelectric conversion apparatus according to claim 2, wherein the conductive member directly contacts with the second impurity region.

8. A photoelectric conversion apparatus including a pixel region having a plurality of photoelectric conversion elements, the photoelectric conversion apparatus comprising:
a semiconductor layer having a first surface and a second surface, the plurality of photoelectric conversion elements being disposed between the first surface and the second surface; and
a transfer transistor having a gate electrode on the first surface,
wherein, in the pixel region, the semiconductor layer includes a first impurity region of a first conductivity type and a second impurity region of a second conductivity type, the first impurity region is a source region or a drain region of the transfer transistor, wherein, in the pixel region, a conductive member is arranged on the first surface, the conductive member forming a contact with the second impurity region, and configured to supply voltage to the second impurity region, wherein, in the pixel region, the semiconductor layer is provided with a groove, the groove continuing to the second surface.

9. The photoelectric conversion apparatus according to claim 8, wherein, a part of the groove overlaps the contact in a direction perpendicular to the first surface.

10. The photoelectric conversion apparatus according to claim 8, wherein, in the pixel region, an element isolating portion is arranged on a side of the first surface, the element isolating portion being constituted by an insulator and at least a part of the gate electrode of a MOS transistor is arranged on the element isolating portion.

11. The photoelectric conversion apparatus according to claim 10, wherein, the element isolating portion has a shallow trench isolation structure.

12. The photoelectric conversion apparatus according to claim 10, wherein, a part of the insulator is arranged between the semiconductor layer and the gate electrode of the MOS transistor.

13. The photoelectric conversion apparatus according to claim 10, wherein, a part of the semiconductor layer is arranged between the insulator and a part of the groove.

14. A camera, comprising:
the photoelectric conversion apparatus according to claim 10; and
at least one of:
a signal processing device configured to process a signal output from the photoelectric conversion apparatus; a storage device configured to store information that is based on a signal output from the photoelectric conversion apparatus;
a display device configured to display information that is based on a signal output from the photoelectric conversion apparatus; and
an optical device configured guide light to the photoelectric conversion apparatus.

15. The photoelectric conversion apparatus according to claim 10, wherein the conductive member directly contacts with the second impurity region.

16. A photoelectric conversion apparatus including a pixel region having a plurality of photoelectric conversion elements, the photoelectric conversion apparatus comprising:
a semiconductor layer having a first surface and a second surface, the plurality of photoelectric conversion elements being disposed between the first surface and the second surface, wherein, in the pixel region, the semiconductor layer includes a first impurity region of a first conductivity type and a second impurity region of a second conductivity type, the first impurity region is a source region or a drain region of a MOS transistor, wherein, in the pixel region, a conductive member is arranged on the first surface, the conductive member forming a contact with the second impurity region, and configured to supply voltage to the second impurity region, wherein, in the pixel region, the semiconductor layer is provided with a groove, the groove continuing to the second surface, and having a first portion and a second portion, wherein in the pixel region, an element isolating portion is arranged on a side of the first surface, the element isolating portion being constituted by an insulator, and wherein the first portion overlaps the element isolation portion and the second portion does not overlap the element isolation portion.

17. The photoelectric conversion apparatus according to claim 16, wherein, a part of the groove overlaps the contact in a direction perpendicular to the first surface, and a part of the element isolating portion overlaps a gate electrode of the MOS transistor.

18. The photoelectric conversion apparatus according to claim 17, wherein, the element isolating portion has a shallow trench isolation structure.

19. The photoelectric conversion apparatus according to claim 17, wherein, a part of the insulator is arranged between the semiconductor layer and a gate electrode of the MOS transistor.

20. The photoelectric conversion apparatus according to claim 17, wherein, a part of the semiconductor layer is arranged between the insulator and a part of the groove.

21. A camera, comprising:

the photoelectric conversion apparatus according to claim 17; and at least one of:

a signal processing device configured to process a signal output from the photoelectric conversion apparatus; a storage device configured to store information that is based on a signal output from the photoelectric conversion apparatus;

a display device configured to display information that is based on a signal output from the photoelectric conversion apparatus; and an optical device configured guide light to the photoelectric conversion apparatus.

22. The photoelectric conversion apparatus according to claim 17, wherein the conductive member directly contacts with the second impurity region.

* * * * *